United States Patent
Gunlycke et al.

(10) Patent No.: US 9,059,265 B2
(45) Date of Patent: Jun. 16, 2015

(54) GRAPHENE RESONANT TUNNELING TRANSISTOR

(71) Applicants: L. Daniel Gunlycke, Alexandria, VA (US); Carter T. White, Annandale, VA (US)

(72) Inventors: L. Daniel Gunlycke, Alexandria, VA (US); Carter T. White, Annandale, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/098,589

(22) Filed: Dec. 6, 2013

(65) Prior Publication Data

US 2014/0166984 A1     Jun. 19, 2014

Related U.S. Application Data

(60) Provisional application No. 61/738,424, filed on Dec. 18, 2012.

(51) Int. Cl.
*H01L 29/775* (2006.01)
*H01L 29/06* (2006.01)
*H01L 29/16* (2006.01)

(52) U.S. Cl.
CPC .......... *H01L 29/775* (2013.01); *H01L 29/0665* (2013.01); *H01L 29/1606* (2013.01)

(58) Field of Classification Search
CPC .......................... H01L 27/286; H01L 29/775
USPC .......................................................... 257/25
See application file for complete search history.

(56) References Cited

U.S. PATENT DOCUMENTS

| | | | |
|---|---|---|---|
| 2010/0102298 A1* | 4/2010 | Wu | 257/25 |
| 2011/0309335 A1* | 12/2011 | Mehr et al. | 257/26 |
| 2012/0212242 A1* | 8/2012 | Masel et al. | 324/693 |
| 2012/0288433 A1* | 11/2012 | Sutter et al. | 423/445 B |

OTHER PUBLICATIONS

A. S. Mayorov, R. V. Gorbachev, S. V. Morozov, L. Britnell, R. Jalil, L. A. Ponomarenko, P. Blake, K. S. Novoselov, K. Watanabe, and T. Taniguchi, "Micrometer-scale ballistic transport in encapsulated graphene at room temperature," Nano Lett., vol. 11, pp. 2396-2399, 2011.

(Continued)

*Primary Examiner* — Zandra Smith
*Assistant Examiner* — Mohammad Choudhry
(74) *Attorney, Agent, or Firm* — US Naval Research Laboratory; Joslyn Barritt (57) ABSTRACT

A graphene device having a ribbon structure with soft boundaries formed between two thin parallel transport barriers in a "railroad track" configuration. Such a structure permits transport along the ribbon, and also permits transport of electrons across the barriers by means of resonant tunneling through quasi-bound states within the railroad track confinement. The transport barriers can be of any form of so long as transport through the barriers leads to the formation of isolated resonant bands with a transport gap. In some embodiments, the transport barriers can be in the form of a pair of parallel line defects, wherein the line defects delineate the central ribbon section and the two lateral sections. In some such embodiments, the line defects are chemically decorated by the adsorption of diatomic gases. In other embodiments, the transport barriers can be formed by the application of large local potentials directly to the graphene sheet.

12 Claims, 10 Drawing Sheets

(56) References Cited

OTHER PUBLICATIONS

A. M. Song, "Room-temperature ballistic nanodevices," Encyclopedia of Nanoscience and Nanotechnology, vol. 9, pp. 371-389, 2004.

C. Berger, Z. Song, X. Li, X. Wu, N. Brown, C. Naud, D. Mayou, T. Li, J. Hass, A. N. Marchenkov, E. H. Conrad, P. N. First, and W. A. De Heer, "Electronic confinement and coherence in patterned epitaxial graphene," Science, vol. 312, pp. 1191-1195, 2006.

M. Y. Han, B. Ozyilmaz, Y. Zhang, and P. Kim, "Energy band-gap engineering of graphene nanoribbons," Phys. Rev. Lett., vol. 98, p. 206805, 2007.

S. S. Datta, D. R. Strachan, S. M. Khamis, and A. T. C. Johnson, "Crystallographic etching of few-layer graphene," Nano Lett., vol. 8, No. 7, pp. 1912-1915, 2008.

L. Ci, Z. Xu, L. Wang, W. Gao, F. Ding, K. F. Kelly, B. I. Yakobson, and P. M. Ajayan, "Controlled nanocutting of graphene," Nano Res., vol. 1, No. 2, pp. 116-122, 2008.

L. C. Campos, V. R. Manfrinato, J. D. Sanchez-Yamagishi, J. Kong, and P. Jarillo-Herrero, "Anisotropic etching and nanoribbon formation in single-layer graphene," Nano Lett., vol. 9, No. 7, pp. 2600-2604, 2009.

D. V. Kosynkin, A. L. Higginbotham, A. Sinitskii, J. R. Lomeda, A. Dimiev, B. K. Price, and J. M. Tour, "Longitudinal unzipping of carbon nanotubes to form graphene nanoribbons," Nature, vol. 458, pp. 872-876, 2009.

L. Jiao, L. Zhang, X. Wang, G. Diankov, and H. Dai, "Narrow graphene nanoribbons from carbon nanotubes," Nature, vol. 458, pp. 877-880, 2009.

J. Cai, P. Ruffieux, R. Jaafar, M. Bieri, T. Braun, S. Blankenburg, M. Muoth, A. P. Seitsonen, M. Saleh, X. Feng, K. Mullen, and R. Fasel, "Atomically precise bottom-up fabrication of graphene nanoribbons," Nature, vol. 466, pp. 470-473, 2010.

M. Koch, F. Ample, C. Joachim, and L. Grill, "Voltage-dependent conductance of a single graphene nanoribbon," Nat. Nanotech., 2012. DOI: 10.1038/nnano.2012.169).

R. Ruoff, "Calling all chemists," Nat. Nanotech., vol. 3, pp. 10-11, 2008.

A. K. Singh and B. I. Yakobson, "Electronics and magnetism of patterned graphene nanoroads," Nano Lett., vol. 9, pp. 1540-1543, 2009.

W.-K. Lee, J. T. Robinson, D. Gunlycke, R. R. Stine, C. R. Tamanaha, W. P. King, and P. E. Sheehan, "Chemically isolated graphene nanoribbons reversibly formed in fluorographene using polymer nanowire masks," Nano Lett., vol. 11, pp. 5461-5464, 2011.

J. Lahiri, Y. Lin, P. Bozkurt, I. I. Oleynik, and M. Batzill, "An extended defect in graphene as a metallic wire," Nat. Nanotech., vol. 5, pp. 326-329, 2010.

D. Gunlycke and C. T. White, "Graphene valley filter using a line defect," Phys. Rev. Lett., vol. 106, p. 136806, 2011.

P. E. Blochl, "Projector augmented-wave method," Phys. Rev. B, vol. 50, pp. 17953-17979, 1994.

G. Kresse and J. Furthmuller, "Efficiency of ab-initio total energy calculations for metals and semiconductors using a plane-wave basis set," Comput. Mat. Sci., vol. 6, pp. 15-50, 1996.

C. T. White, J. Li, D. Gunlycke, and J. W. Mintmire, "Hidden one-electron interactions in carbon nanotubes revealed in graphene nanostrips," Nano Lett., vol. 7, No. 3, pp. 825-830, 2007.

D. Gunlycke and C. T. White, "Valley and spin polarization from graphene line defect scattering," J. Vac. Sci. Technol. B, vol. 30, p. 03D112, 2012.

D. J. Klein, "Graphitic polymer strips with edge states," Chem. Phys. Lett., vol. 217, No. 3, pp. 261-265, 1994.

M. Fujita, K. Wakabayashi, K. Nakada, and K. Kusakabe, "Peculiar localized state at zigzag graphite edge," J. Phys. Soc. Jpn., vol. 65, No. 7, pp. 1920-1923, 1996.

D. Gunlycke, S. Vasudevan, and C. T. White, "Confinement, Transport Gap, and Valley Polarization in Graphene from Two Parallel Decorated Line Defects," Nano Lett. 13, 259 (2013).

A. Zettl, J.-H. Chen, N. Alem, G. Autes, F. Gargiulo, A. Gautam, M. Linck, C. Kisielowski, O. V. Yazyev, and S. G. Louie, "Growth of a linear topological defect in graphene as a gate-tunable valley valve." AVS 59th International Exhibition and Symposium (2012).

L. Brey and H. A. Fertig, "Electronic states of graphene nanoribbons studied with the dirac equation," Phys. Rev. B, vol. 73, p. 235411, 2006.

\* cited by examiner

Lahiri et al., Nature Nanotech. 5, 326 (2010)

Transmission probability across single decorated line defect

Maximum transmission $T_{max} \approx (2\gamma/\varepsilon_{LD})^2$

FIG. 4B  H-decorated

FIG. 4A  Undecorated

GRAPHENE RESONANT TUNNELING TRANSISTOR

CROSS-REFERENCE

This application is a Nonprovisional of, and claims the benefit of priority under 35 U.S.C. §119 based on, U.S. Provisional Patent Application No. 61/738,424 filed on Dec. 18, 2012, the entirety of which is hereby incorporated by reference into the present application.

TECHNICAL FIELD

The present invention relates to graphene-based nanoelectronics, and in particular to a graphene-based resonant tunneling transistor.

BACKGROUND

At the heart of electronics lies the ability to control electron flow across a solid structure. Electron flow is constantly switched on and off in transistors within integrated circuits. The performance of such circuits is related to the number of transistors in a given volume. It is well known, however, that as their size approach atomic scale, conventional transistors cannot operate normally and will increasingly fail due to uncontrolled electron scattering within the transistor.

Graphene is a stable, flat, and inert two-dimensional material that offers room temperature ballistic transport well over one micron, longer than in any other known material. See A. S. Mayorov, R. V. Gorbachev, S. V. Morozov, L. Britnell, R. Jalil, L. A. Ponomarenko, P. Blake, K. S. Novoselov, K. Watanabe, and T. Taniguchi, "Micrometer-scale ballistic transport in encapsulated graphene at room temperature," *Nano Lett.*, Vol. 11, pp. 2396-2399, 2011; and A. M. Song, "Room-temperature ballistic nanodevices," *Encyclopedia of Nanoscience and Nanotechnology*, Vol. 9, pp. 371-389, 2004. Such properties make graphene a great candidate material for ballistic transistors, in which electrons can travel between source and drain contacts with little, if any, uncontrolled scattering.

The main obstacle preventing a breakthrough in graphene-based nanoelectronics is that graphene is a semi-metal without any transport gap needed to be able to shut off current. Engineering a gap in graphene without degrading its otherwise exceptional transport properties has proven to be a hard task that has yet to be solved.

To create such a gap, a lot of effort has been devoted to making graphene nanoribbons that are structurally isolated.

One approach to doing so has been through lithographic cutting. See C. Berger, Z. Song, X. Li, X. Wu, N. Brown, C. Naud, D. Mayou, T. Li, J. Hass, A. N. Marchenkov, E. H. Conrad, P. N. First, and W. A. de Heer, "Electronic confinement and coherence in patterned epitaxial graphene," *Science*, Vol. 312, pp. 1191-1195, 2006; and M. Y. Han, B. Özyilmaz, Y. Zhang, and P. Kim, "Energy band-gap engineering of graphene nanoribbons," *Phys. Rev. Lett.*, Vol. 98, p. 206805, 2007.

Another approach has used nanoparticle cutting. See S. S. Datta, D. R. Strachan, S. M. Khamis, and A. T. C. Johnson, "Crystallographic etching of few-layer graphene," *Nano Lett.*, Vol. 8, no. 7, pp. 1912-1915, 2008; L. Ci, Z. Xu, L. Wang, W. Gao, F. Ding, K. F. Kelly, B. I. Yakobson, and P. M. Ajayan, "Controlled nanocutting of graphene," *Nano Res.*, Vol. 1, no. 2, pp. 116-122, 2008; and L. C. Campos, V. R. Manfrinato, J. D. Sanchez-Yamagishi, J. Kong, and P. Jarillo-Herrero, "Anisotropic etching and nanoribbon formation in single-layer graphene," *Nano Lett.*, Vol. 9, no. 7, pp. 2600-2604, 2009.

Other methods for making structurally isolated graphene nanoribbons involve unzipping of nanotubes, see D. V. Kosynkin, A. L. Higginbotham, A. Sinitskii, J. R. Lomeda, A. Dimiev, B. K. Price, and J. M. Tour, "Longitudinal unzipping of carbon nanotubes to form graphene nanoribbons," *Nature*, Vol. 458, pp. 872-876, 2009; and L. Jiao, L. Zhang, X. Wang, G. Diankov, and H. Dai, "Narrow graphene nanoribbons from carbon nanotubes," *Nature*, Vol. 458, pp. 877-880, 2009; or bottom-up synthesis, see J. Cai, P. Ruffieux, R. Jaafar, M. Bieri, T. Braun, S. Blankenburg, M. Muoth, A. P. Seitsonen, M. Saleh, X. Feng, K. Mullen, and R. Fasel, "Atomically precise bottom-up fabrication of graphene nanoribbons," *Nature*, Vol. 466, pp. 470-473, 2010; and M. Koch, F. Ample, C. Joachim, and L. Grill, "Voltage-dependent conductance of a single graphene nanoribbon," *Nat. Nanotech.*, 2012. DOI: 10.1038/nnano.2012.169).

Still other methods for making structurally isolated graphene nanoribbons use chemical methods within functionalized graphene. See R. Ruoff, "Calling all chemists," *Nat. Nanotech.*, Vol. 3, pp. 10-11, 2008; A. K. Singh and B. I. Yakobson, "Electronics and magnetism of patterned graphene nanoroads," *Nano Lett.*, Vol. 9, pp. 1540-1543, 2009; and W.-K. Lee, J. T. Robinson, D. Gunlycke, R. R. Stine, C. R. Tamanaha, W. P. King, and P. E. Sheehan, "Chemically isolated graphene nanoribbons reversibly formed in fluorographene using polymer nanowire masks," *Nano Lett.*, Vol. 11, pp. 5461-5464, 2011.

Irrespective of the method in which they are made, the edges in all these nanoribbons are hard boundaries that restrict transport to one dimension, and unless the edges are smooth on atomic scale, edge roughness will significantly degrade the transport properties. See D. Gunlycke, D. A. Areshkin, and C. T. White, "Semiconducting graphene nanostrips with edge disorder," *Appl. Phys. Lett.*, Vol. 90, p. 142104, 2007.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a graphene device having a ribbon structure with soft boundaries formed between two thin parallel transport barriers in a "railroad track" configuration. Such a structure permits transport along the ribbon, and also permits transport of electrons across the barriers by means of resonant tunneling through quasi-bound states within the railroad track confinement. For highly reflective barriers, the resonances form continuous bands that closely match the band structure of a nanoribbon, except for the boundary-localized states, which cannot carry any transport across the railroad track structure due to energy and crystal momentum conservation. The resonance bands must therefore terminate at the crossover between extended and boundary-localized states. As the confined region contains no states near the Fermi level extending across the railroad track structure, electrons approaching this structure experience a sizable transport gap.

Thus, a graphene device in accordance with the present invention comprises a central graphene ribbon section and two lateral graphene sections on opposite sides thereof, the central graphene ribbon section being separated from the two lateral graphene sections by a pair of parallel thin transport barriers, which form the "railroad track" structure.

Each transport barrier is, by itself, configured to limit the transmitted electrons to a fraction of the incoming electrons from an electron source, for all angles of incidence.

Brought together in the railroad track structure, the overall structure is configured to cause a first plurality of the incoming electrons to travel towards the central ribbon section, to cause a second plurality of electrons from the electron source to be reflected at the central ribbon section back to the electron source, and to cause a third plurality of electrons from the electron source to be transmitted through the central ribbon section by means of resonant tunneling.

The transport barriers can be of any form so long as transport through the parallel barriers leads to the formation of isolated resonance bands with a transport gap.

For example, in some embodiments, the transport barriers are in the form of a pair of parallel chemically decorated line defects, wherein the line defects delineate the central ribbon section and the two lateral sections. In some such embodiments, the line defects are decorated by the adsorption of diatomic gases such as hydrogen ($H_2$), oxygen ($O_2$), or fluorine ($F_2$) to form adatoms on the defect sites, which increase the magnitude of the potential created by the presence of the defects. In other embodiments, the transport barriers can be formed by the application of large local potentials directly to the graphene sheet without the use of line defects.

In some embodiments, the graphene device can be used in a transistor comprising the graphene device, a source, a gate, and a drain, wherein one of the lateral graphene sections is contacted to the source and the opposite lateral graphene section is contacted to the drain, with the electron transport through the device being actively controlled using the gate.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

Figure 1A:
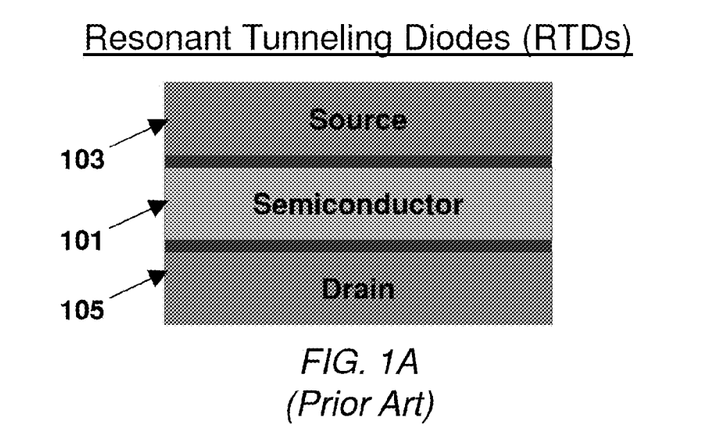
FIGS. 1A and 1B are block diagrams illustrating aspects of exemplary tunneling structures in accordance with the prior art, with FIG. 1A illustrating aspects of a prior art resonant tunneling diode and FIG. 1B depicting aspects of a prior art resonant tunneling transistor.
Figure 1B:
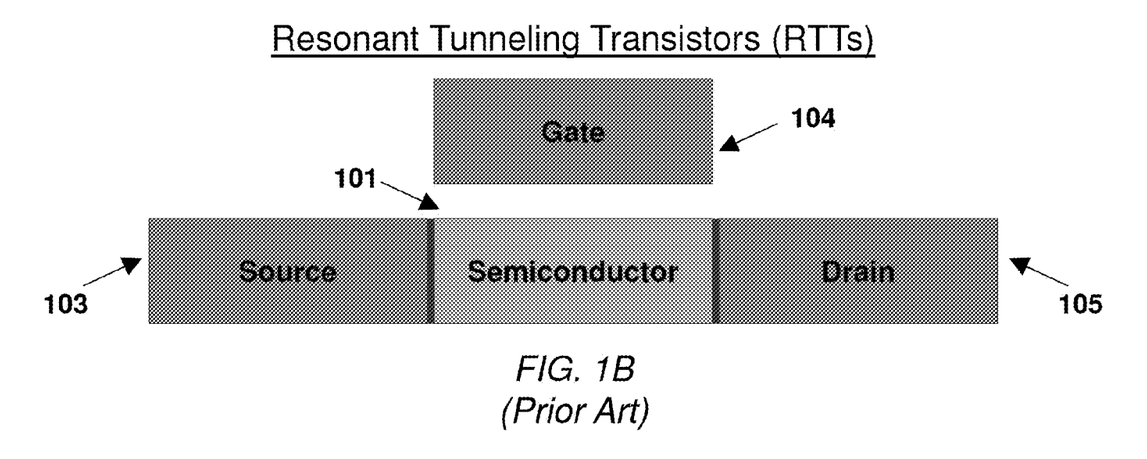

Resonant tunneling diodes are existing devices making their way into the commercial world. A typical resonant tunneling diode is illustrated in FIG. 1A, and inclues a source 103, a semiconductor material layer 101, and a drain 105 arranged in a vertical direction. Such devices make use of electron transport in the vertical direction, which can typically be controlled with great accuracy. The layout, however, cannot easily be gated, and thus the devices are not suitable as transistor switches. Resonant tunneling transistors, such as that illustrated in FIG. 1B, have also been proposed. Like a resonant tunneling diode, such devices can include a source 103, a semiconductor material layer 101, and drain 105, but with the components arranged laterally instead of vertically, and can further include a gate 104 which can switch the lateral electron transport through the device on and off through adjustments to the gate voltage. Implementation of the latter resonant tunneling transistors is problematic, however, as typical semiconductors cannot support ballistic transport at room temperature over the lateral length scales typically used in these devices.

With its exceptional electron transport properties, graphene would appear to be an attractive material for such devices, but, as noted above, it is a semi-metal, which prevents its use in traditional transistor devices requiring a large on-off ratio. The present invention provides a resonant tunneling graphene device that can overcome this problem and permit the development of transistors that can take advantage of the exceptional transport of graphene.

As described in more detail below, a resonant tunneling graphene device in accordance with the present invention comprises a graphene sheet having a ribbon structure with soft boundaries formed between two thin parallel transport barriers in a "railroad track" configuration. This structure permits transport along the ribbon, and also permits transport of electrons across the barriers by means of resonant tunneling through quasi-bound states within the railroad track confinement.

Each transport barrier is, by itself, configured to be highly reflective, which we define to mean that the number of the transmitted electrons is merely a fraction of the incoming electrons from an electron source, regardless of the angles of incidence.

Brought together in the railroad track structure, the overall structure is configured to cause a first plurality of the incoming electrons to travel towards the central ribbon section, to cause a second plurality of electrons from the electron source to be reflected at the central ribbon section back to the electron source, and to cause a third plurality of electrons from the electron source to be transmitted through the central ribbon section by means of resonant tunneling. For highly reflective barriers, the resonances form continuous bands that closely match the band structure of a nanoribbon, except for the boundary-localized states, which cannot carry any transport due to energy and crystal momentum conservation. The resonance bands must therefore terminate at the crossover between extended and boundary-localized states. As the confined region contains no states near the Fermi level extending across the railroad track structure, electrons approaching this structure experience a sizable transport gap.

The transport barriers can be of any form so long as transport through the parallel barriers leads to the formation of isolated resonant bands with a transport gap.

For example, in some embodiments, the transport barriers are in the form of a pair of parallel chemically decorated line defects, wherein the line defects delineate the central ribbon section and the two lateral sections. In some such embodiments, the line defects are decorated by the adsorption of diatomic gases such as hydrogen ($H_2$), oxygen ($O_2$), or fluorine ($F_2$) to form adatoms on the defect sites, which increase the magnitude of the potential created by the presence of the defects. In other embodiments, the transport barriers can be formed by the application of large local potentials directly to the graphene sheet without the use of line defects.

As described in more detail below, a graphene device in accordance with the present invention can be used in a transistor wherein one of the lateral graphene sections is contacted to a source and the opposite lateral graphene section is contacted to a drain, wherein the third plurality of electrons described above is transmitted to the drain, and wherein the electron transport through the device can be actively controlled using a gate. Such a transistor can take advantage of the exceptional ballistic transport properties of graphene while still permitting transport to be switched off due to the transport gap induced by the transport barriers.

Figure 2:
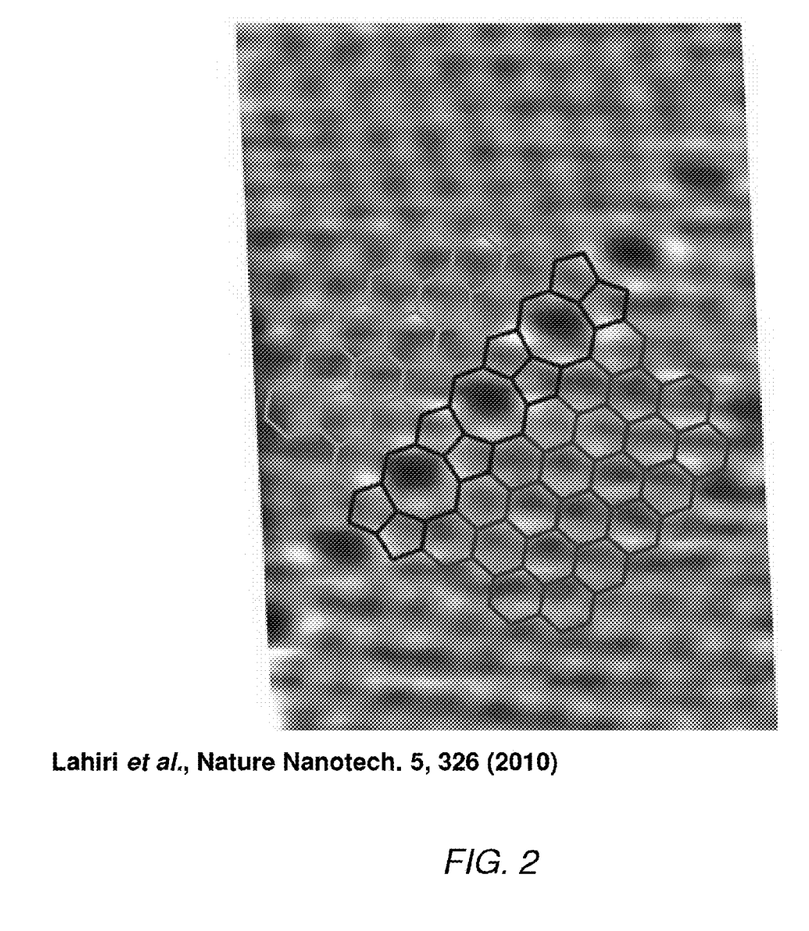
FIG. 2 is a scanning tunneling microscopy image depicting a 5-5-8 line defect in graphene that may be utilized in some embodiments of the present invention.

In an exemplary embodiment illustrated in the FIGURES and described herein, a 5-5-8 line defect is employed to provide a thin transport barrier which enables resonant tunneling in the graphene device. As illustrated in the scanning tunneling microscopy (STM) image shown in FIG. 2, such a 5-5-8 line defect consists of a pair of hexagons alternating with an octagon and extends along a graphene sheet in a zigzag direction. See J. Lahiri, Y. Lin, P. Bozkurt, I. I. Oleynik, and M. Batzill, "An extended defect in graphene as a metallic wire," *Nat. Nanotech.*, Vol. 5, pp. 326-329, 2010. The 5-5-8 line defect has been controllably fabricated. See A. Zettl, J.-H. Chen, N. Alem, G. Autes, F. Gargiulo, A. Gautam, M. Linck, C. Kisielowski, O. V. Yazyev, and S. G. Louie, "Growth of a linear topological defect in graphene as a gate-tunable valley valve." AVS 59th International Exhibition and Symposium. It should be noted that the present invention is not limited to graphene devices having a 5-5-8 line defect and that other line defects in graphene can also serve as transport barriers in a graphene device in accordance with the present invention.

Such a line defect is semitransparent with extended states at the Fermi level, and, therefore, although it reduces the transport of electrons across the graphene structure, it is generally not a highly reflective transport barrier by itself. See D. Gunlycke and C. T. White, "Graphene valley filter using a line defect," *Phys. Rev. Lett.*, Vol. 106, p. 136806, 2011, the entirety of which is hereby incorporated by reference into the present disclosure. The transport barrier, however, is highly reflective in the presence of a local potential that pulls the conducting states away from the Fermi level. See D. Gunlycke, S. Vasudevan, and C. T. White, "Confinement, Transport Gap, and Valley Polarization in Graphene from Two Parallel Decorated Line Defects," *Nano Lett.* 13, 259 (2013), the entirety of which is hereby incorporated by reference into the present disclosure.

Such a potential can be induced by decoration of the line defect through adsorption of another element on the surface of the defect sites. The line defect is highly reactive, compared to the relatively inert graphene, and therefore easily attracts adsorbates that increase the potential and thus decrease the transmission probability across the defect. See D. Gunlycke, 2013, supra. In exemplary embodiments described herein and illustrated in the FIGURES, the potential is induced through decoration of the line defect through adsorption of one of the diatomic gases, i.e., hydrogen (H2), oxygen (O2), or fluorine (F2) on the defect sites. However, as the adsorbates are simply used to generate a local potential on the defect sites, other adsorbates may also work well, and use of such other adsorbates is also considered to be within the scope and spirit of the present invention.

Figure 3A:
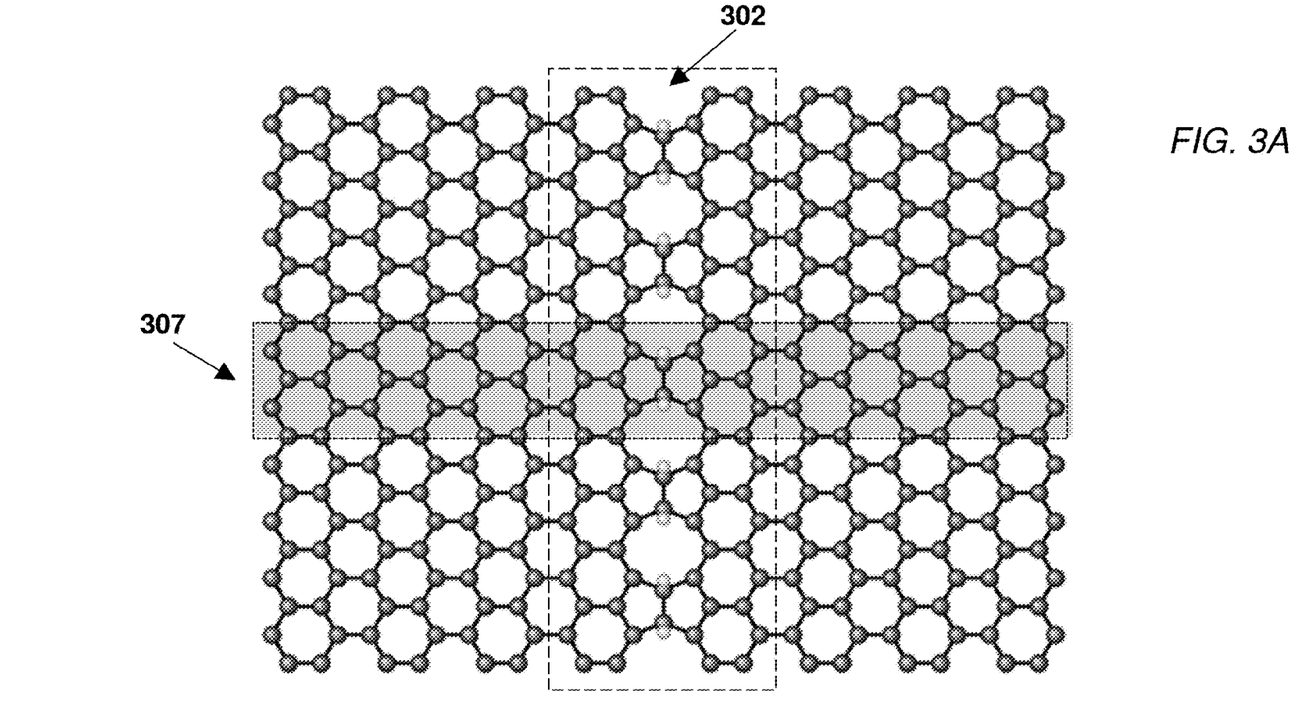
FIGS. 3A-3D illustrate aspects of chemically decorated line defects in a graphene sheet used to form a graphene resonant tunneling transistor in accordance with some embodiments of the present invention.

FIGS. 3A-3D are block diagrams further illustrating aspects of a 5-5-8 line defect used in an exemplary graphene device in accordance with the present invention. As shown in FIG. 3A and as described above, an exemplary graphene sheet used in a graphene device of the present invention includes a graphene sheet in which a line defect such as 5-5-8 line defect 302 which has been chemically decorated, e.g., by hydrogen gas, has been formed.

Figure 3B:
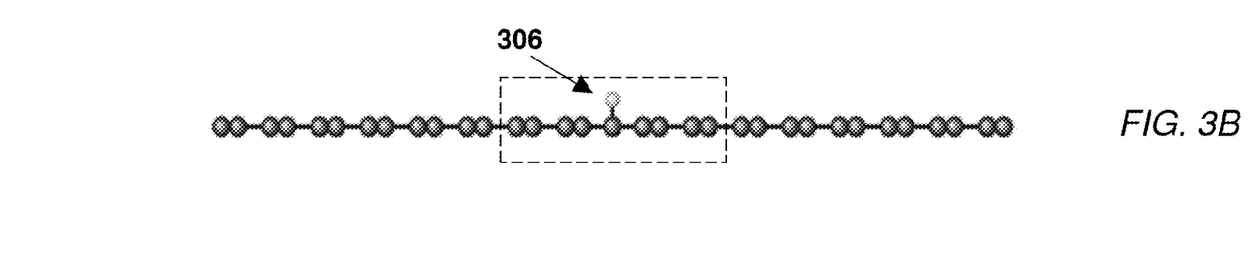
Figure 3C:
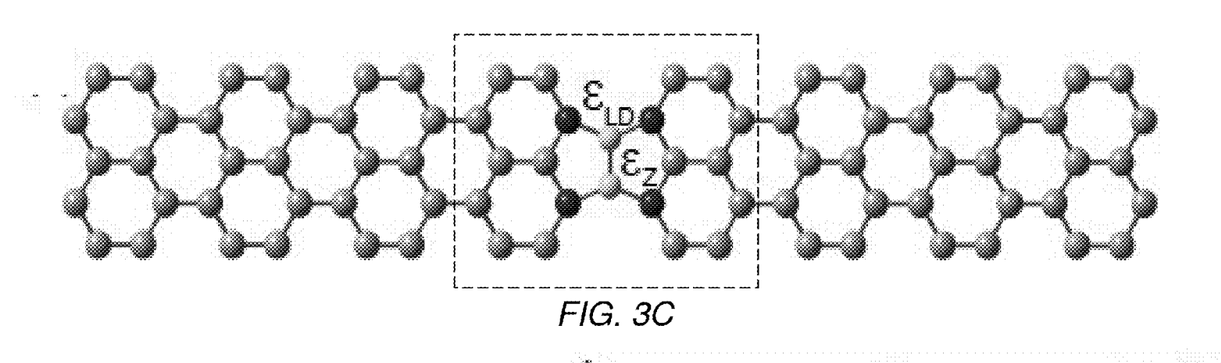

First-principles calculations based on density functional theory (DFT) were performed and show that all the considered diatomic gases bind to the line defect as paired adatoms 306 located roughly above the central carbon sites in the 5-5-8 line defect, as shown in FIG. 3A and in more detail in FIG. 3B. The DFT calculations were performed using the projector augmented wave method, see P. E. Blochl, "Projector augmented-wave method," *Phys. Rev. B*, Vol. 50, pp. 17953-17979, 1994, as implemented in the Vienna ab initio simulation package known in the art, see G. Kresse and J. Furthmuller, "Efficiency of ab-initio total energy calculations for metals and semiconductors using a plane-wave basis set," *Comput. Mat. Sci.*, Vol. 6, pp. 15-50, 1996. The calculations relied on the local spin-density approximation, and we used a kinetic cutoff energy of 400 eV for all of the present elements. Full geometry optimizations were performed using 9 uniformly spaced, Γ-centered reciprocal grid points along the line defect. Primitive cell 307 of the structure contained 68 atoms and the lattice parameters and atomic positions were optimized until all atomic forces were less than 0.015 eV/Å.

The binding energy $E_b$ of the adatom, the shortest carbon-adatom bond length $d_{CX}$, the shortest adatom separation $d_{XX}$ and the onsite energies $\epsilon_{LD}$ and $\epsilon_Z$ are shown in TABLE 1 below.

TABLE 1

| Molecule | $E_b$ (eV) | $d_{CX}$ (Å) | $d_{XX}$ (Å) | $\epsilon_{LD}$ (eV) | $\epsilon_Z$ (eV) |
|---|---|---|---|---|---|
| H2 | 0.49 | 1.12 | 2.24 | −27.1 | −0.30 |
| O2 | 0.46 | 1.48 | 1.45 | 12.8 | 0.28 |
| F2 | 4.36 | 1.39 | 2.39 | 24.5 | 0.43 |

These binding energies reflect the total energy difference between a diatomic molecule isolated above the line defect and adsorbed on the surface. We notice large separations between the atoms in hydrogen and fluorine. These large separations are not surprising, as both hydrogen and fluorine must dissociate to be able to bind covalently to the line defect. That hydrogen and fluorine dissociate, while reacting exothermically to the line defect, indicates that the bonds to the surface are quite strong. Because the dissociation energy is much smaller for fluorine than hydrogen, the binding energy for fluorine on the line defect is much larger than that for hydrogen. No dissociation is observed for oxygen, as these molecules are able to bind covalently to the surface, while remaining singly bonded.

Figure 3D:
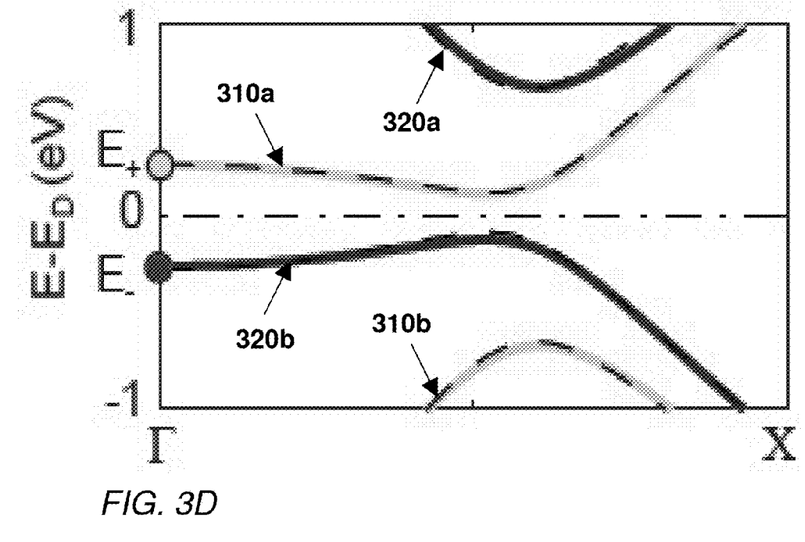

To gain better understanding of how the energy bands of the line defects are affected by the adsorption, we used a nearest-neighbor tight-binding model consisting of orthonormal π-orbital states at the carbon sites with the parameter $\gamma=-2.6$ eV describing the hopping between neighboring sites. See C. T. White, J. Li, D. Gunlycke, and J. W. Mintmire, "Hidden one-electron interactions in carbon nanotubes revealed in graphene nanostrips," *Nano Lett.*, Vol. 7, no. 3, pp. 825-830, 2007. To capture the effects of the adsorbed molecules, we also introduce two carbon onsite energy parameters, $\in_{LD}$ and $\in_Z$ illustrated in FIG. 3C, where $\in_{LD}$ represents the potential induced by the presence of the adsorbate atoms at the line defect sites and $\in_Z$ represents the potential induced on the sites neighboring the line defect. See FIG. 3C. These onsite energies can be determined uniquely from the first-principles energies $E_\pm$ of the boundary-localized states at Γ, as shown in the plots in FIG. 3D, which plot the band structure of the periodically repeating line defect shown in FIG. 3A from the zone center Γ to the zone edge along the line defect Y. In the plots shown in FIG. 3D, plots $310a/310b$ depict symmetric states and plots $320a/320b$ depict asymmetric states, with the dashed energy bands being obtained from first-principles calculations and the solid bands obtained from semi-empirical ones.

These states are completely localized on the relevant sites with the onsite energies $\in_{LD}$ and $\in_Z$.

The induced potential along the line defect has a strong effect on the boundary-localized states due to their large density on the affected sites. Making use of the reflection symmetries both across and along the line defect, we find that $\in_{LD}=E_++2\gamma^2/\Delta E$, where $\Delta E=E_+-E_-$ is the energy separation between the symmetric and antisymmetric boundary-localized states at Γ. Because the antisymmetric state with respect to reflection about the line defect has a node at the reflection plane, we obtain $\in_Z=E_-$ shown in the plot. The values for $\in_{LD}$ and $\in_Z$ obtained using our model for a hydrogen-decorated line defect are listed in Table 1 above.

The potential induced by the presence of hydrogen, oxygen, or fluorine along the line defect thus produces an atomically thin but effective barrier to electron transport converting the line defect from semitransparent, see Gunlycke 2011, supra, to highly reflective. This is illustrated in the plots shown in FIGS. 4A and 4B, described in more detail below, which depict the transmission probability across the line defect is reported without and with adsorbed hydrogen, respectively. The quantum transport calculations were performed exactly within our tight-binding model using a Green function approach. The method is described elsewhere for a closely related model, including how to solve the self-energy recurrence relations for the 5-5-8 line defect. See D. Gunlycke and C. T. White, "Valley and spin polarization from graphene line defect scattering," *J. Vac. Sci. Technol. B*, Vol. 30, p. 03D112, 2012, the entirety of which is incorporated by reference into the present disclosure.

Figure 4A:
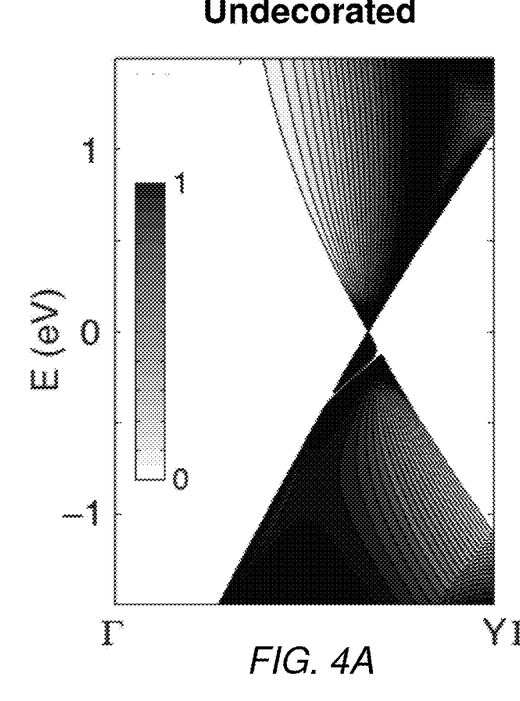
FIGS. 4A and 4B are plots of transmission probability along a bare line defect (FIG. 4A) and a line defect decorated with hydrogen in accordance with some embodiments of the present invention (FIG. 4B).
Figure 4B:
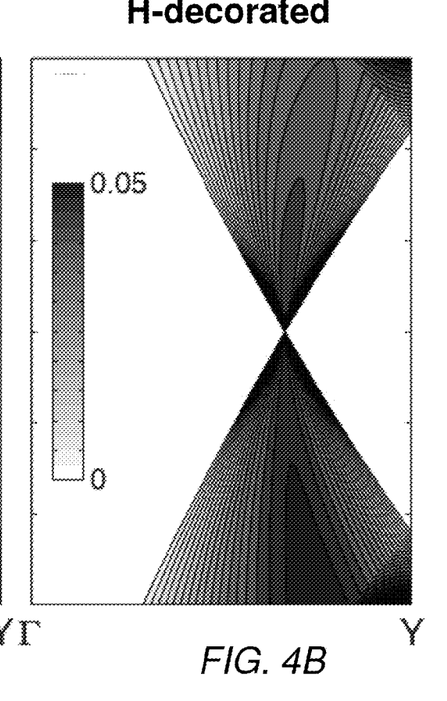

The transmission probability is plotted as a function of the energy E and the wave vector in the direction of the line defect. These two quantities completely specify the incoming graphene state. FIGS. 4A and 4B are plots showing the transmission probability for an undecorated line defect (FIG. 4A) and a chemically decorated line defect in accordance with the present invention. The energy dispersion of graphene restricts transmission near the Fermi level to the Dirac cones. The Dirac cone at one of the valleys are seen as triangular areas in FIGS. 4A and 4B. If the transmission were perfect in FIG. 4A (i.e., transmission probability of 100%, shown by the black shading), the triangular areas would be completely filled in black. Although this is not the case, the plot in FIG. 4A shows substantial black areas, illustrating that the bare line defect remains highly transparent. In contrast, the plot in FIG. 4B showing transmission probability for a hydrogen-decorated line defect in accordance with the present invention shows that such a decorated line defect is in fact highly reflective, with a transmission probability never exceeding 5%. See Gunlycke 2013, supra. Similar low transmission limits are obtained for fluorine- and oxygen-decorated line defects.

The highly reflective nature of these chemically decorated line defects make them ideal candidates for the rails in a nanoscale railroad track structure as described above which can be used to produce and control a transport gap in graphene.

Figure 5:
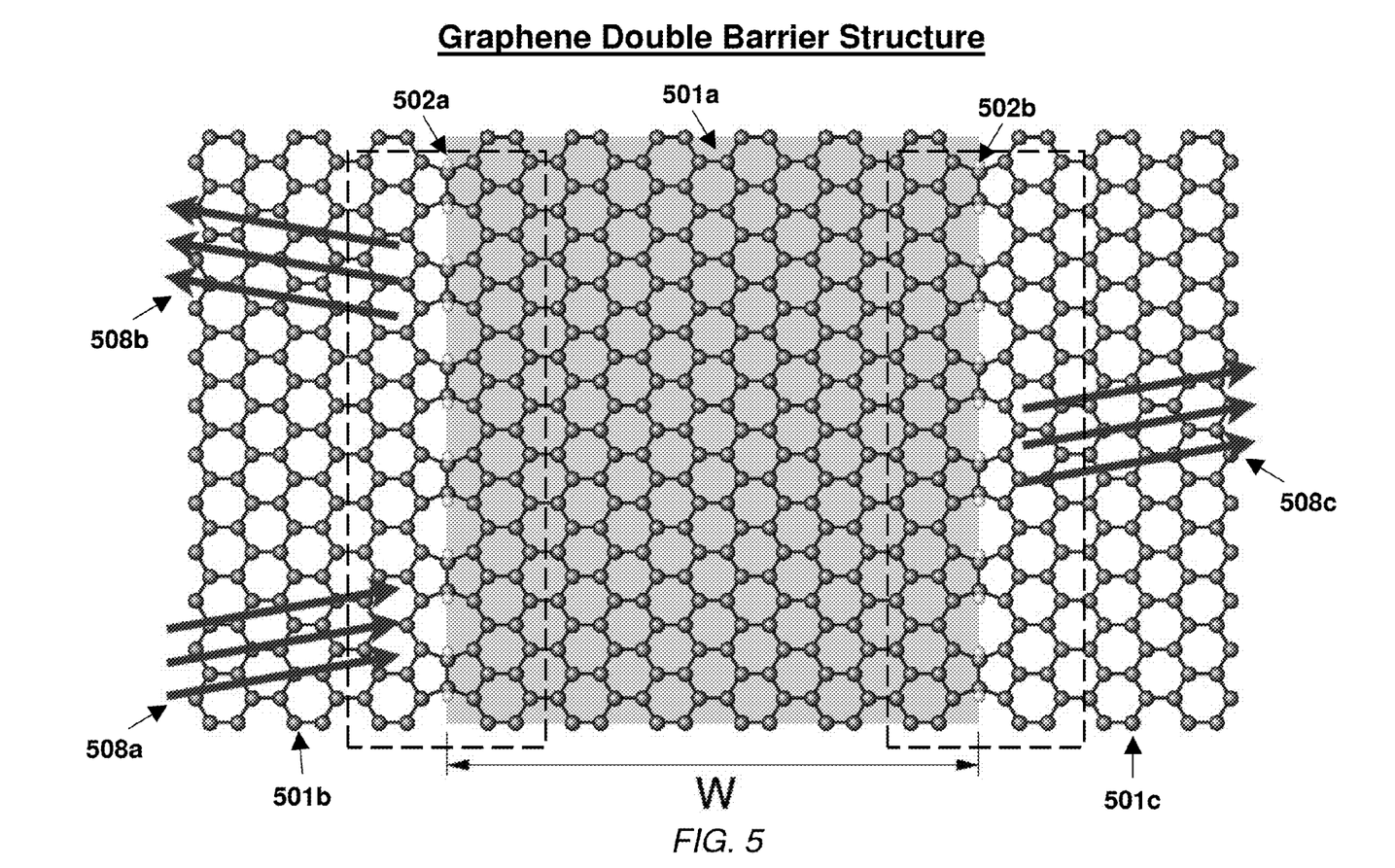
FIG. 5 illustrates aspects of a graphene sheet having a double-decorated line defect structure in accordance some embodiments of with the present invention.

FIG. 5 depicts exemplary aspects of a graphene device having such a railroad track structure in accordance with the present invention. As illustrated in FIG. 5, in such a graphene device, two parallel reflective transport barriers in a graphene sheet, such as line defects $502a/502b$ separated by a distance W shown in FIG. 5, can be used to form a narrow central strip $501a$ and two lateral graphene sections $501b/501c$. As described further below, when the graphene device is used as a components of a transistor, lateral sections $501b/501c$ can serve as leads to a source and a drain contacted thereto. As described above, the barriers are configured to cause a first plurality $508a$ of the incident electrons to travel towards the central ribbon section, to cause a second plurality $508b$ of electrons from the electron source to be reflected at the central ribbon section back to the electron source, and to cause a third plurality $508c$ of electrons from the electron source to be transmitted through the central ribbon section to a drain by means of resonant tunneling.

Figure 6A:
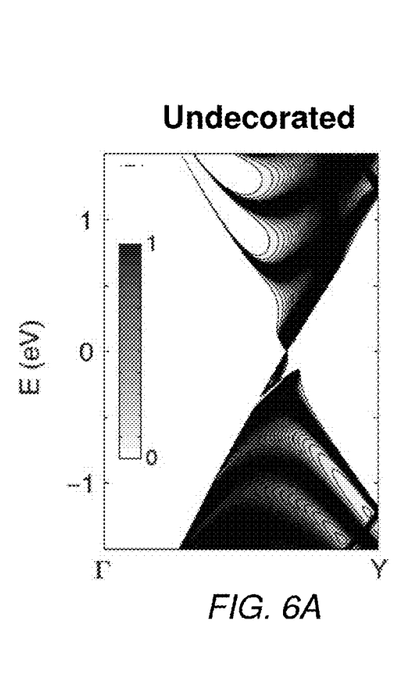
FIGS. 6A-6D are plots illustrating aspects of transmission probability in a graphene sheet having a pair of line defects in accordance with some embodiments of the present invention.
Figure 6B:
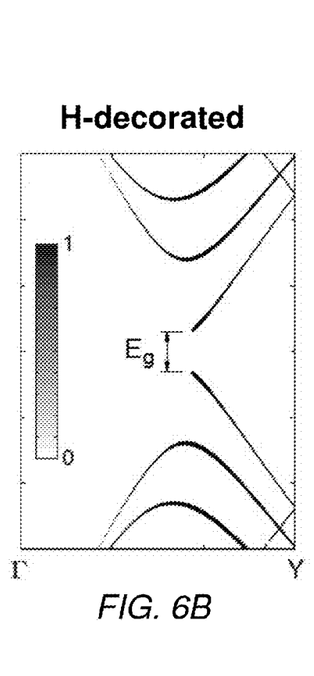
Figure 6C:
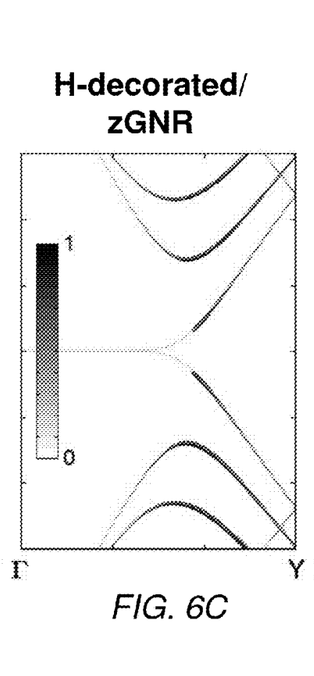

FIGS. 6A-6D are plots illustrating aspects of the resonant effects of transport across a graphene device in accordance with the present invention. Electron transport across such a structure is driven by resonant tunneling. If the transmission probability through one of the two rails is high, the transmission probability across the entire railroad track structure is generally high too, as seen from the plot in FIG. 6A for the structure without any chemical decoration. Although some dark resonance bands are emerging, there is no gap due to a symmetric band crossing the Fermi level at the Dirac point. See Gunlycke 2011, supra. The plot in FIG. 6B shows the transmission probability for the structure having hydrogen-decorated line defect in accordance with the present invention. As can be seen from the plot in FIG. 6B, the low transmission probability through each line defect has begun to isolate the states in the confinement from the outside graphene states, resulting in sharper resonance bands. For a large enough potential, these resonance bands are centered around the corresponding allowed electronic bands of an isolated zigzag ribbon, as illustrated in the plot shown in FIG. 6C. See D. J. Klein, "Graphitic polymer strips with edge states," *Chem. Phys. Lett.*, Vol. 217, no. 3, pp. 261-265, 1994; and M. Fujita, K. Wakabayashi, K. Nakada, and K. Kusakabe, "Peculiar localized state at zigzag graphite edge," *J. Phys. Soc. Jpn.*, Vol. 65, no. 7, pp. 1920-1923, 1996. An important difference, however, is that in the case of a structure having a decorated line defect in accordance with the present invention, the resonance bands closest to the Fermi level terminate abruptly, resulting in the transport gap Eg shown in FIG. 6B.

Figure 6D:
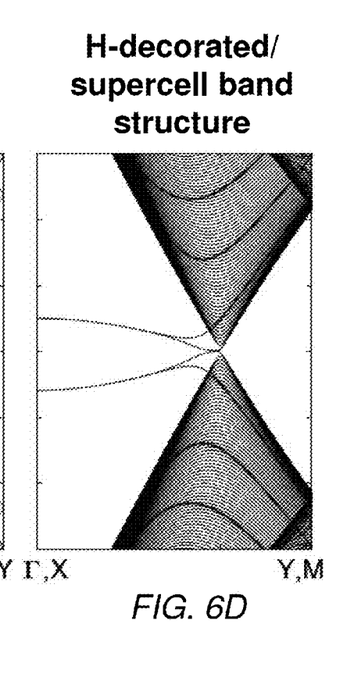

To gain further insight into this behavior, we have calculated the band structure in FIG. 6D for the railroad track structure periodically repeated with the ratio between neighboring railroad tracks and the confined width being 20:1. Almost all bands are localized in the direction across the structure. Consistent with FIG. 6B, extended states can only be found when the states are allowed to propagate in both graphene and the confined region. As can be seen from FIG. 6D, the resonance bands terminate at the dimensional crossover, where the embedded nanoribbon states leave the Dirac cone and become boundary-localized and hence are no longer able to support extended states across the structure.

Figure 7A:
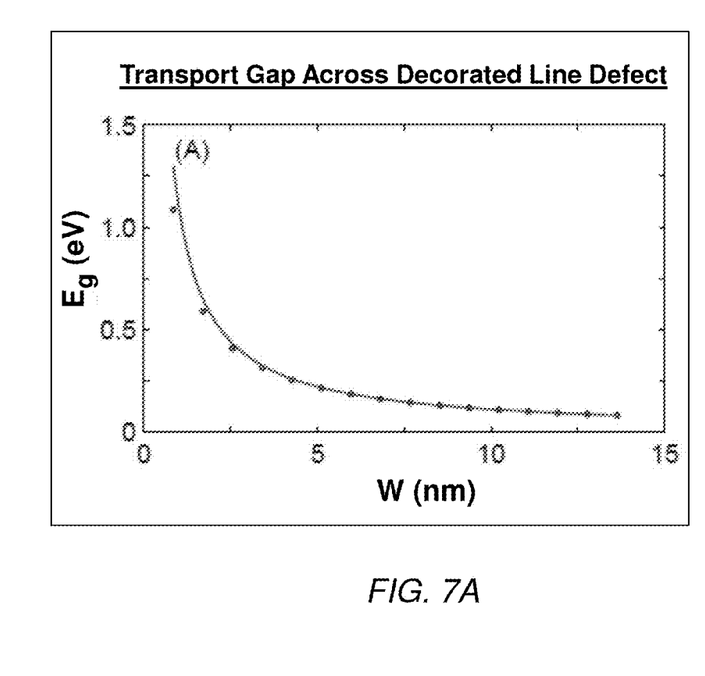
FIGS. 7A and 7B are plots illustrating aspects of a transport gap (FIG. 7A) and conductance (FIG. 7B) across a decorated line defect in graphene in accordance with some embodiments of the present invention.

This crossover can be estimated from the isolated zigzag ribbon. In this case, the states of the ribbon supports two distinctly different types of states, those that extend both along and across the ribbon and those that only extend along the ribbon edges. Within the Dirac approximation, the former have energies $E=\pm h v_F \sqrt{q_x^2 + q_y^2}$, where $q_x$ and $q_y$ are wave vectors measured from the center of the Dirac cones that satisfy the transcendental equation $q_y = \pm q_x / \tan(q_x W)$, where the sign depends on which valley is considered. Those states that extend both along and across the ribbon only exist to the critical point $q_x^c = 0$ at which $q_y^c = \pm 1/W$. See L. Brey and H. A. Fertig, "Electronic states of graphene nanoribbons studied with the dirac equation," *Phys. Rev. B*, vol. 73, p. 235411, 2006. Therefore, the transport gap is approximately given by $$E_g(W) = \frac{2 \hbar v_F}{W} \quad (1)$$

where $2 \hbar v_F = \sqrt{3} |\gamma| \alpha \approx 1.11$ eV nm. This expression agrees well with the numerically obtained values, as can be seen from the plot in FIG. 7A, which plots the transport gap $E_g$ as a function of the distance W between the barriers. Thus, the magnitude of the transport gap in a graphene device in accordance with the present invention can be tuned by varying the separation W between the transport barriers forming the railroad track structure in the graphene sheet.

Figure 7B:
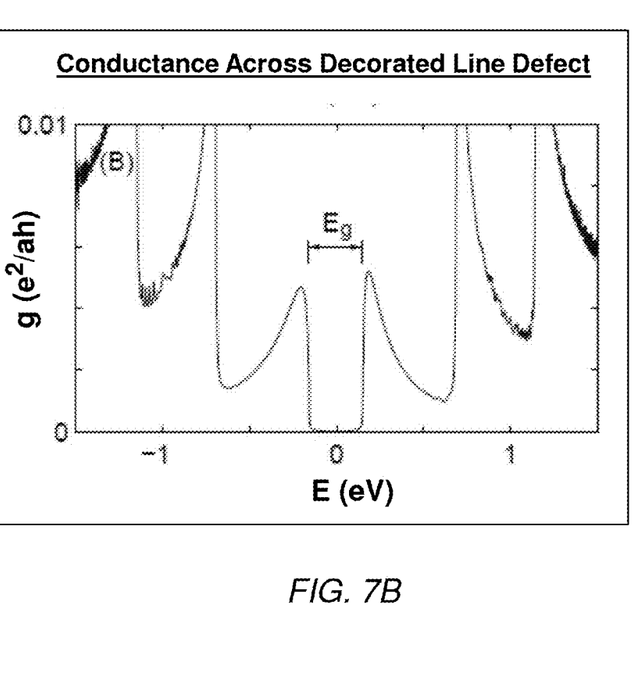

The transport gap is also apparent in the conductance of such a structure as reflected in the plot shown in FIG. 7B, which plots conductance across the structure per unit length g as a function of energy, as given by Equation (2) below:

$$g(E) = \frac{e^2}{a h} \frac{2a}{\pi} \int_0^{\pi/2a} T(E, k_y) dk_y, \quad (2)$$

where $\alpha$ is the graphene lattice constant and $T(E, k_y)$ is the transmission probability obtained from the quantum transport calculations reflected in the plot shown in FIG. 6B. We note that the conductance is proportional to the length of the line defects. The peaks in the plot shown in FIG. 7B are reminiscent of one-dimensional van-Hove singularities, though they are not actually singularities at all but instead occur at the van Hove singularities because the resonance bands in FIG. 6B span a larger portion of the wave vectors at these energies.

Thus, the double barrier structure in graphene in accordance with the present invention can be used to create a transport gap and obtain a ribbon-like confinement. However, in other embodiments, it may be possible to obtain similar results without the need for the presence of the line defects, i.e., by directly decorating portions of the graphene to produce large local potentials. The latter results indicate that the transport gap is not sensitive to the nature of the transport barrier, as long as the barriers are highly reflective. See Supplemental Material to Gunlycke 2013, supra. In still other embodiments, the transport barrier can be created in a graphene structure by the use of chemically decorated strips of a second material situated on either side of a central graphene ribbon in the railroad track configuration described above. All that is required is that transport through the barriers leads to the formation of isolated resonant bands with a transport gap.

The railroad track structures described herein can be combined to form more advanced structures on the mesoscopic scale, and ultimately be used in graphene-based scalable electronics.

As noted above, in some embodiments, the graphene device can be used in a transistor wherein one of the lateral graphene sections is contacted to a source and the opposite lateral graphene section is contacted to a drain, and wherein the electron transport through the device can be controlled using the transport barriers in the graphene material. Such a transistor can take advantage of the exceptional ballistic transport properties of graphene while still permitting such transport to be controlled.

Figure 8:
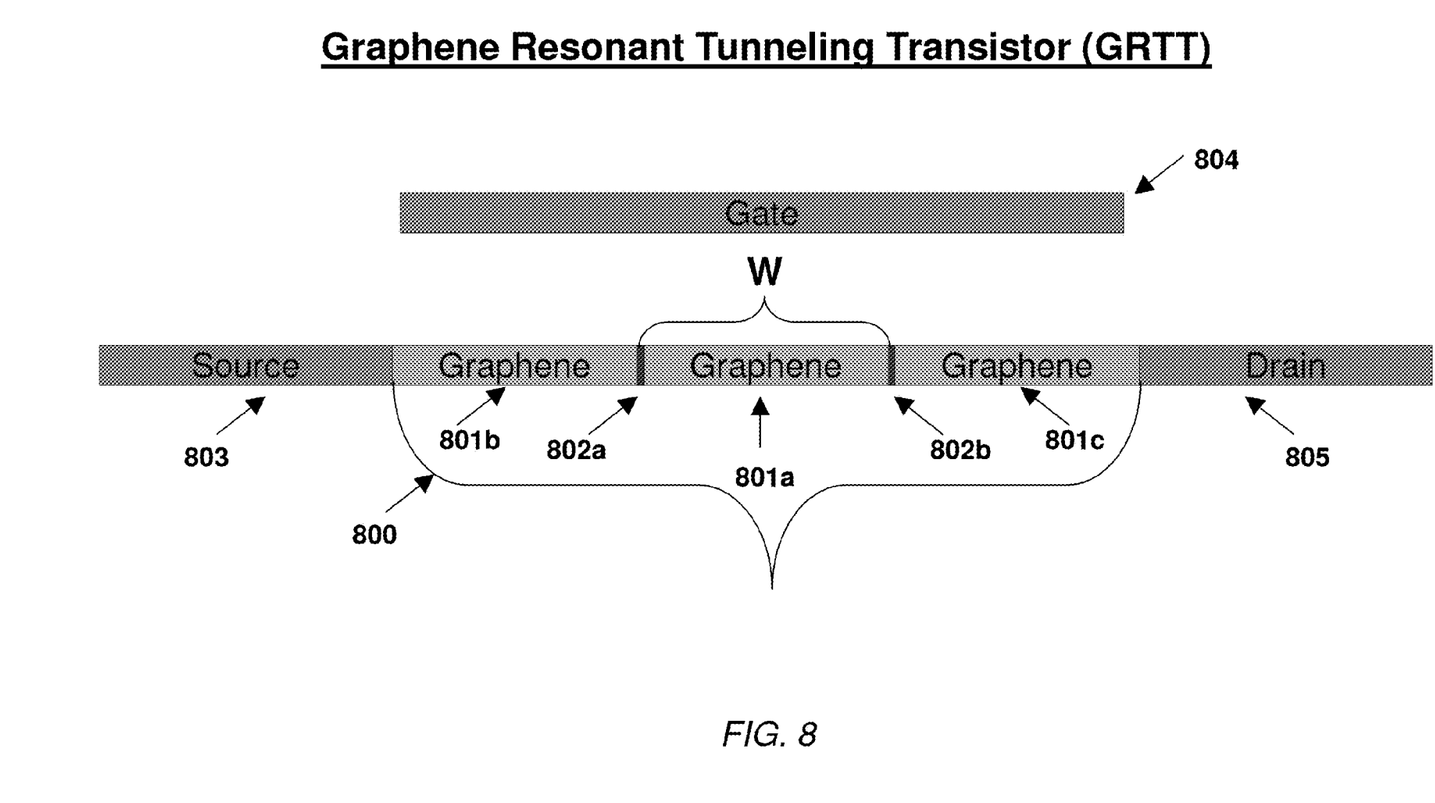
FIG. 8 is a block diagram illustrating aspects of graphene resonant tunneling transistor in accordance with some embodiments of the present invention.

As illustrated in the block diagram shown in FIG. 8, a graphene resonant tunneling transistor in accordance with the present invention includes a resonant tunneling graphene device 800 contacted on one side by a source 803 and on the other side by a drain 805, the resonant tunneling graphene device further comprising a graphene sheet divided into a central section 801a and two lateral sections 801b/801c by transport barriers 802a/802b separated from each other by a distance W, where the lateral sections 801b/801c serve as leads to source 803 and drain 805, respectively.

As with other forms of transistor, the current through a graphene resonant tunneling transistor in accordance with the present invention can be controlled by a gate such as gate 804. In the "on" state the gate voltage is adjusted so that transport across the device occurs through the resonance bands formed by the railroad track structure. In the "off" state the gate voltage is adjusted so that the Fermi level lies within the transport gap. This transport gap differs from that of conventional semiconductors. In conventional semiconductors, a transport gap occurs because there is an energy gap between the highest occupied and lowest unoccupied states. Here, there is no such gap between the highest occupied and lowest unoccupied states. Rather, a transport gap arises because of a crossover at a critical point between states able to support transport across the device to those that are boundary localized along the tracks and hence unable to support transport across the device. As noted above, the magnitude of the transport gap can be tuned by varying the distance W between the tracks.

Figure 9:
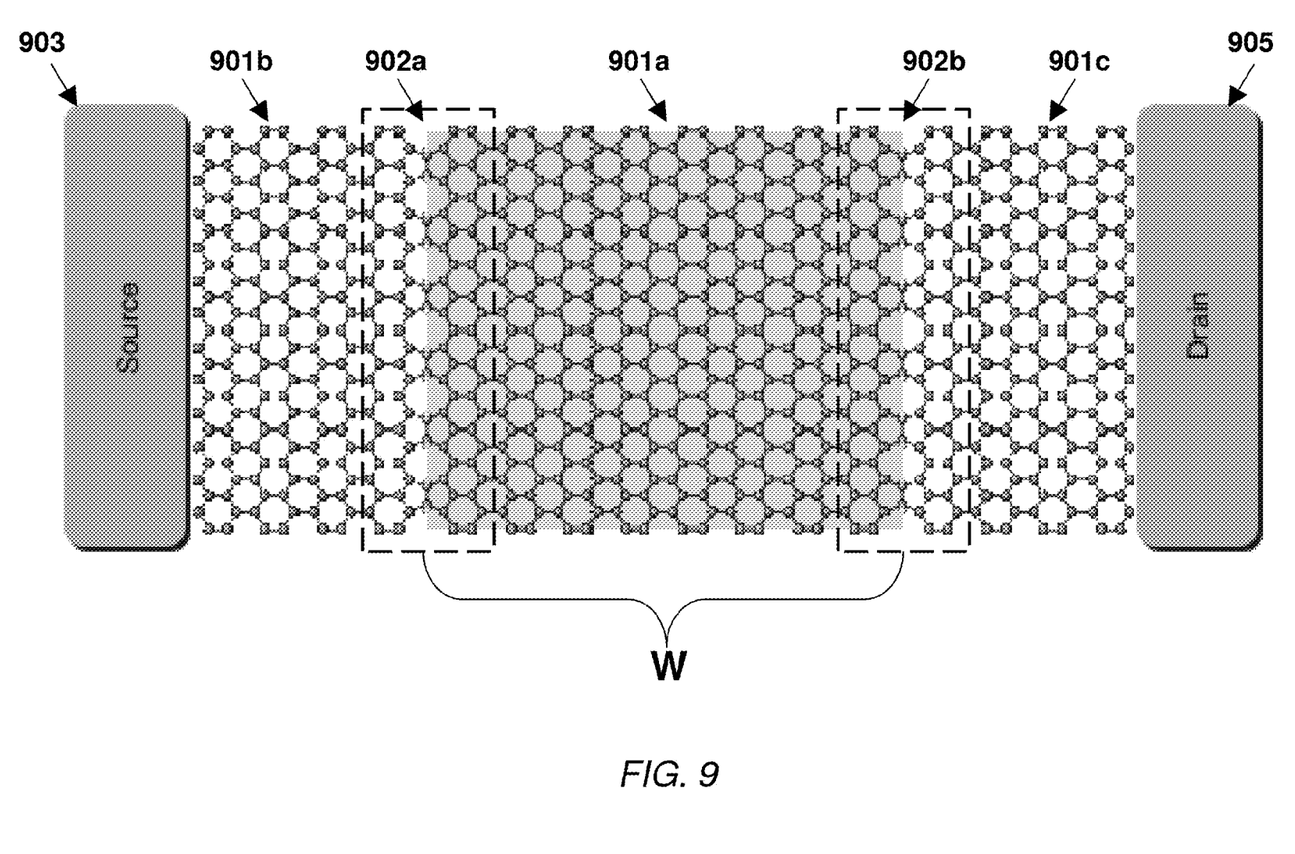
FIG. 9 illustrates aspects of an exemplary embodiment of a graphene resonant tunneling transistor in accordance with some embodiments of the present invention.

FIG. 9 illustrates aspects of an exemplary embodiment of a graphene resonant tunneling transistor in accordance with the present invention. As illustrated in FIG. 9, such a transistor includes a graphene structure as described above which includes a graphene sheet comprising a central graphene ribbon section 901a, lateral graphene sections 901a/901b, and a pair of decorated parallel line defects 902a/902b separated by a distance W formed in a railroad track configuration in the graphene sheet between the central ribbon section 901a and the lateral sections 901b/901c. The lateral sections are contacted to a source electrode 903 and a drain electrode 905. Current switching can be achieved by using any suitable gate electrode such as gate electrode 804 shown in FIG. 8, separated from the line defects by a thin dielectric, to shift the electro-chemical potential into or out of the resonance bands shown in FIG. 4A.

Advantages and New Features

The present invention is based on graphene, which exhibits room-temperature ballistic transport long enough for use in resonant transistor designs. The invention overcomes the band gap problem in graphene and allows for the fabrication of in-plane resonant tunneling-based transistor switches.

This transistor supports ballistic transport, unlike conventional transistors in semiconducting materials. It can be fabricated from atomically thin graphene, leaving the vertical dimension free for use in more advanced circuit design. A large amount of transistor could be densely packed in large crystalline sheets of graphene with automatic alignment of individual transistors.

Although particular embodiments, aspects, and features have been described and illustrated, it should be noted that the invention described herein is not limited to only those embodiments, aspects, and features, and it should be readily appreciated that modifications may be made by persons skilled in the art. The present application contemplates any and all modifications within the spirit and scope of the underlying invention described and claimed herein, and all such embodiments are within the scope and spirit of the present disclosure.

What is claimed is:

1. A resonant tunneling graphene device comprising:
   a graphene sheet comprising a central ribbon section and first and second lateral sections, each of the first and second lateral sections being separated from the central ribbon section by a respective one of a pair of parallel highly reflective transport barriers;
   wherein the transport barriers are configured to cause a first plurality of carriers from a carrier source to be reflected laterally at the central ribbon section back to the carrier source, and to cause a second plurality of carriers from the carrier source to be transmitted laterally through the central ribbon section by means of resonant tunneling; and
   further wherein the transport barriers are configured to produce a transport gap across the central ribbon section that controls a size of the first and second pluralities of carriers, a magnitude of the transport gap being tuned by varying a distance between the transport barriers;
   wherein the distance between the transport barriers is less than 50 nm.

2. The resonant tunneling graphene device according to claim 1, wherein the transport barriers comprise a pair of parallel line defects formed in the graphene sheet.

3. The resonant tunneling graphene device according to claim 1, wherein the transport barriers comprise a pair of parallel chemically decorated 5-5-8 line defects formed in the graphene sheet.

4. The resonant tunneling graphene device according to claim 3, wherein the line defects are decorated through adsorption of atoms from a diatomic gas contacting the graphene sheet.

5. The resonant tunneling graphene device according to claim 4, wherein the diatomic gas is hydrogen ($H_2$), oxygen ($O_2$), or fluorine ($F_2$).

6. The resonant tunneling graphene device according to claim 1, wherein the transport barriers comprise areas of large local potentials applied directly to the graphene sheet.

7. A resonant tunneling transistor, comprising:
   a resonant tunneling graphene device, a source, a gate, a drain;
   the graphene device comprising a graphene sheet comprising a central ribbon section, a first lateral section contacted to the source and a second lateral section contacted to the drain, each of the first and second lateral sections being separated from the central ribbon section by a respective one of a pair of parallel highly reflective transport barriers;
   wherein the transport barriers are configured to cause a first plurality of carriers from the source to be reflected laterally at the central ribbon section back to the source, and to cause a second plurality of electrons from the source to be transmitted through the central ribbon section to the drain by means of resonant tunneling, the transport of the first and second pluralities of carriers being controlled by the gate and further wherein the transport barriers are configured to produce a transport gap across the central ribbon section that controls a size of the first and second pluralities of carriers, a magnitude of the transport gap being tuned by varying a distance between the transport barriers;
   wherein the distance between the transport barriers is less than 50 nm.

8. The resonant tunneling transistor according to claim 7, wherein the transport barriers comprise a pair of parallel line defects formed in the graphene sheet.

9. The resonant tunneling transistor according to claim 7, wherein the transport barriers comprise a pair of parallel chemically decorated 5-5-8 line defects formed in the graphene sheet.

10. The resonant tunneling transistor according to claim 9, wherein the line defects are decorated through adsorption of atoms from a diatomic gas contacting the graphene sheet.

11. The resonant tunneling transistor according to claim 10, wherein the diatomic gas is hydrogen ($H_2$), oxygen ($O_2$), or fluorine ($F_2$).

12. The resonant tunneling transistor according to claim 7, wherein the transport barriers comprise areas of large local potentials applied directly to the graphene sheet.

* * * * *